United States Patent
Lum et al.

(10) Patent No.: US 8,942,055 B2
(45) Date of Patent: Jan. 27, 2015

(54) VOLTAGE BATTERY

(71) Applicants: Annie-Li-Keow Lum, San Jose, CA (US); Kuoyuan (Peter) Hsu, San Jose, CA (US)

(72) Inventors: Annie-Li-Keow Lum, San Jose, CA (US); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 41 days.

(21) Appl. No.: 13/765,384

(22) Filed: Feb. 12, 2013

(65) Prior Publication Data
US 2014/0146629 A1    May 29, 2014

Related U.S. Application Data

(60) Provisional application No. 61/729,502, filed on Nov. 23, 2012.

(51) Int. Cl.
*G11C 5/14*    (2006.01)

(52) U.S. Cl.
CPC .................................. *G11C 5/14* (2013.01)
USPC ................................. 365/226; 365/230.06

(58) Field of Classification Search
USPC ......................................... 365/226, 230.06
See application file for complete search history.

(56) References Cited

U.S. PATENT DOCUMENTS

| 6,181,611 B1 * | 1/2001 | Liu  | 365/189.06 |
| 7,061,820 B2 * | 6/2006 | Deng | 365/227 |

* cited by examiner

*Primary Examiner* — Michael Tran
(74) *Attorney, Agent, or Firm* — Lowe Hauptman & Ham, LLP

(57) ABSTRACT

A circuit includes a voltage generating circuit and a voltage keeper circuit. The voltage generating circuit includes a first node. The voltage keeper circuit includes a second node and a third node. The first node is coupled with the second node. The voltage generating circuit is configured to generate a voltage value at the first node and the second node to maintain the third node at a particular third node voltage.

20 Claims, 7 Drawing Sheets

US 8,942,055 B2

VOLTAGE BATTERY

FIELD

The present disclosure is related to a voltage keeper.

BACKGROUND

A voltage keeper refers to a circuit that keeps a node at a particular logical value, such as a high logical value, in a memory macro application, for example. On one hand, the voltage keeper is designed to keep the node at the high logical value while other circuits in the memory macro tend to pull the node away from the high logical value. In such a situation, the voltage keeper is stronger than the other circuits, otherwise the node will not be kept at the high logical value. On the other hand, when the node changes to a low logical value, the voltage keeper is weaker than the other circuits to allow the node to transition to such a low logical value. In some existing approaches, to cover manufacturing process variations, multiple voltage keepers are implemented in different sections of the memory macro. Further, a transistor length of transistors implemented as the voltage keeper is relatively large, which affects polysilicon pattern accuracy of the memory array in the memory macro and of other transistors close to the area of the voltage keeper. A large die area of the voltage keeper also reduces efficiency of the memory cells.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
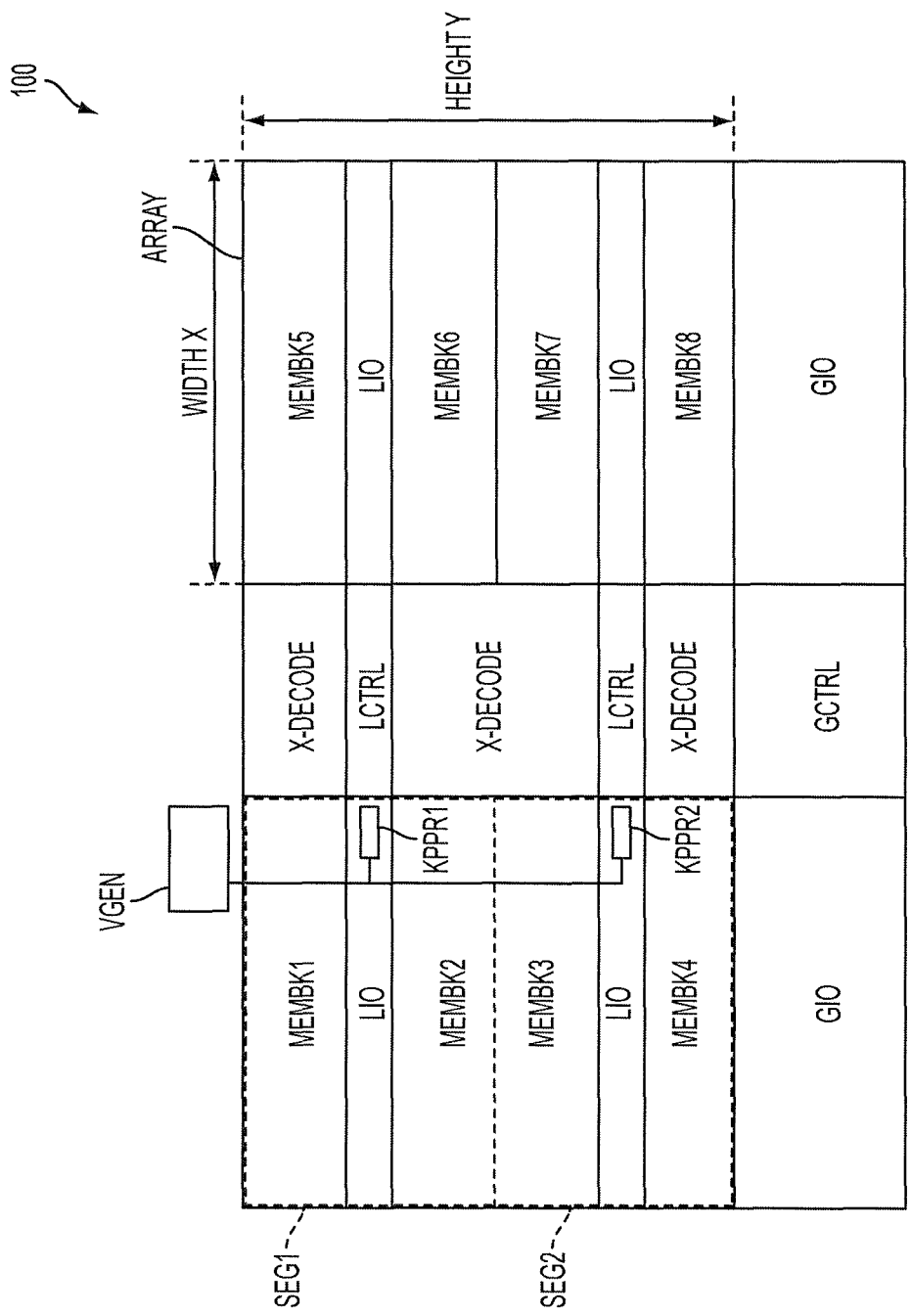
FIG. 1 is a diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. In some embodiments, a voltage generating circuit provides selectable voltages to a plurality of voltage keepers. Compared with at least one existing approach, a die area of circuits related to the voltage keepers is reduced. In some embodiments, a current generating circuit provides selectable currents. A selected current is mirrored to and is used by a plurality of voltage keepers. A total area of the current generating circuit and the plurality of voltage keepers is smaller than the total area in a compatible solution used in another approach.

Memory Macro

FIG. 1 is a diagram of a memory macro 100, in accordance with some embodiments. In FIG. 1, memory macro 100 is a static random access memory (SRAM) macro. Other types of memories are within the scope of various embodiments.

Memory macro 100 is symmetrical. For example, with reference to decoders X-Decode, local control circuits (LCTRLs), and a global control circuit (GCTRL), circuit elements on the left side are similar to circuit elements on the right side of memory macro 100. In some embodiments, memory macro 100 includes two memory arrays. One memory array is on the left side and one memory array is on the right side of memory macro 100. For illustration, one memory array on the right side is labeled as memory array ARRAY that has a width X and a height Y.

Each memory array ARRAY includes a plurality of memory segments. For illustration, two memory segments SEG1 and SEG2 of the memory array on the left of memory macro 100 are shown. A different number of memory segments is within the scope of various embodiments.

Each memory segment includes two memory banks. For example, memory segment SEG1 includes two memory banks MEMBK1 and MEMBK2, and memory segment SEG2 includes two memory banks MEMBK3 and MEMBK4. For illustration, only memory segments SEG1 and SEG2 are labeled. Details of other memory banks MEMBK5, MEMBK6, MEMBK7, and MEMBK8 of other memory segments are not labeled.

In a memory segment, two memory banks share a row of a local input-output circuit LIO. For example, memory banks MEMBK1 and MEMBK2 share one LIO, memory banks MEMBK3 and MEMBK4 share one LIO, memory banks MEMBK5 and MEMBK6 share one LIO, and memory banks MEMBK7 and MEMBK8 share one LIO.

Memory cells in a memory bank are arranged in rows and columns. As a result, memory cells in a memory segment and in a memory array are also arranged in rows and columns. A memory cell is described with reference to FIG. 2 below, and is labeled MEMCELL. Different configurations of a memory segment are within the scope of various embodiments.

An address decoder X-Decode provides the row-address of corresponding memory cells to be accessed for a read or a write operation. A local control LCTRL controls a corresponding local LIO. A global input-output circuit GIO serves to transfer data between memory cells in a corresponding memory array and other circuits outside of memory macro 100. Global control GCTRL provides the row address, the column address pre-decode, clock, and other signals for memory macro 100. Global control GCTRL also controls data transfer between memory cells in the memory array and circuits outside of memory macro 100.

A voltage generating circuit VGEN provides a voltage to a plurality of voltage keepers in a column of a memory array of memory macro 100. In some embodiments, one memory column has one voltage generating circuit VGEN. As a result, if NC is the number of columns in the memory array, NC is also the number of voltage generating circuits VGEN in the corresponding memory array. For illustration, only one voltage generating circuit VGEN is shown in FIG. 1.

As illustratively shown in FIG. 1, voltage generating circuit VGEN provides a voltage to voltage keepers KPPR1 and KPPR2. Each of voltage keepers KPPR1 and KPPR2 is in a corresponding LIO. Further, a memory array of memory macro 100 includes two LIOs in a column. A memory column therefore includes two voltage keepers. But if the memory column includes a different number of LIOs in a column, the memory column includes a corresponding different numbers of voltage keepers.

Each voltage keeper is shared between two memory banks. For example, voltage keeper KPPR1 is shared between memory banks MEMBK1 and MEMBK2 while voltage keeper KPPR2 is shared between memory banks MEMNK3 and MEMBK4. A voltage keeper KPPR1 and/or KPPR2 shared between another number of memory banks is within the scope of various embodiments. Details of voltage generating circuit VGEN3 and voltage keeper KPPR 1 are explained with reference to FIG. 3.

In some embodiments, voltage generating circuit VGEN3 is part of a corresponding global input-output GIO. Various embodiments of the disclosure are not limited to a location of voltage generating circuit VGEN3 and/or a location of the voltage keepers, such as voltage keepers KPPR1 and KPPR2.

Memory Cell

Figure 2:
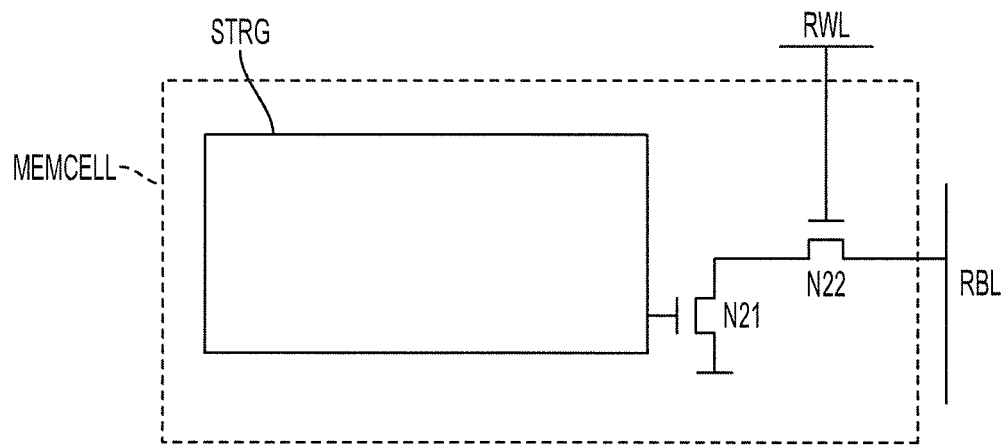
FIG. 2 is a diagram of a memory cell of the memory macro in FIG. 1, in accordance with some embodiments.

FIG. 2 is a diagram of a memory cell MEMCELL coupled with a read word line RWL and a read bit line RBL, in accordance with some embodiments.

Memory cell MEMCELL includes a storage unit STRG and a read port that includes two N-type metal oxide semiconductor (NMOS) transistors N21 and N22.

A gate of transistor N21 receives data from storage unit STRG. A source of transistor N21 receives a reference voltage, which, in some embodiments, is ground. A drain of transistor N21 is coupled with a source of transistor N22. A gate of transistor N22 is coupled with read word line RWL. A drain of transistor N22 is coupled with read bit line RBL. In some embodiments, read word line RWL is coupled with gates of transistors N22 in a row of memory cells MEMCELL in a memory bank. Further, read bit line RBL is coupled with drains of transistors N22 in a column of memory cells MEMCELL in a memory bank.

When memory cell MEMCELL is accessed for a read operation, detecting a logical value on read bit line RBL reveals the logical data stored in memory MEMCELL. For example, in some embodiments, in a read operation, read bit line RBL is pre-charged with a high logical value. Pre-charge refers to charging before a read or a write operation. Further, read word line RWL is activated with a high logical value. As a result, transistor N22 is turned on. In some embodiments, when storage unit STRG stores a high logical value, storage unit STRG provides a low logical value to the gate of transistor N21. Consequently, transistor N21 is turned off, and transistors N21 and N22 function as an open circuit. Read bit line RBL therefore remains at the pre-charged high logical value. In other words, the high logical value on read bit line RBL corresponds to the high logical data stored in storage unit STRG. In contrast, when storage unit STRG stores a low logical value, storage unit STRG provides a high logical value to the gate of transistor N21. As a result, transistor N21 is turned on. Because transistors N21 and N22 are turned on, read bit line RBL is pulled to a low logical value at the source transistor N21. In other words, the low logical value on read bit line RBL corresponds to the low logical data stored in storage unit STRG.

Figure 3:
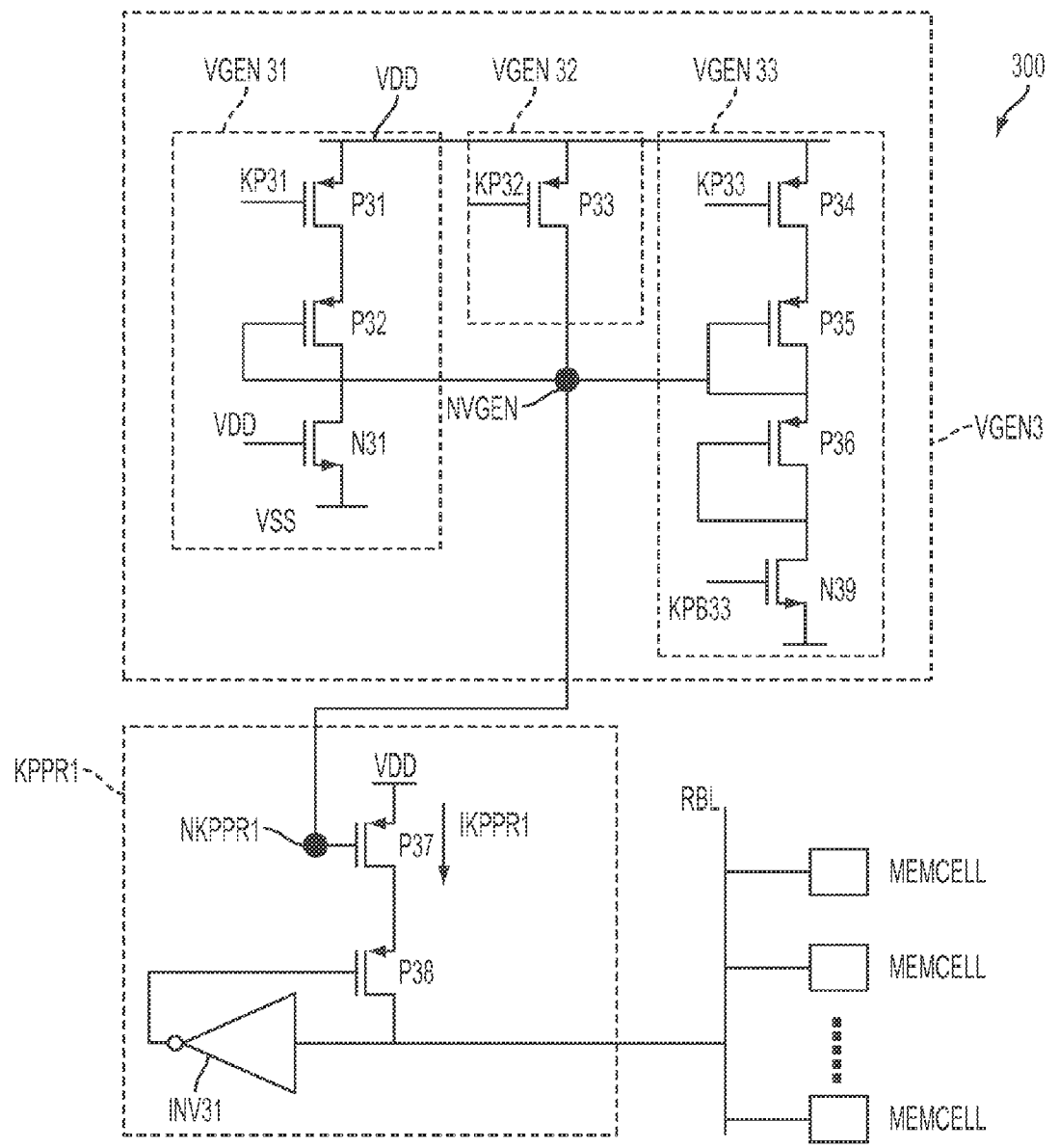
FIG. 3 is a diagram of a circuit that includes an embodiment of a voltage generating circuit and a voltage keeper circuit of the memory macro in FIG. 1, in accordance with some embodiments.

FIG. 3 is a diagram of a circuit 300, in accordance with some embodiments. Circuit 300 includes a voltage generating circuit VGEN3 coupled with voltage keeper KPPR1.

Voltage Generating Circuit VGEN3

Voltage generating circuit VGEN3 is an embodiment of voltage generating circuit VGEN in FIG. 1. A node NVGEN of circuit VGEN3 is coupled with a node NKPPR1 of voltage keeper KPPR1. In some embodiments, circuit VGEN3 provides a voltage VNVGEN (not labeled) on node NVGEN as a voltage VNKPPR1 (not labeled) on node NKPPR1.

In some embodiments, circuit VGEN3 is coupled with additional voltage keepers. In such a situation, node NVGEN is coupled with additional nodes of the additional voltage keepers that correspond to node NKPPR1. For example, node NVGEN is coupled with a node NKPPR2 (not labeled) of voltage keeper KPPR2 in FIG. 1, a node NKPPR3 (not shown) of voltage keeper KPPR3 (not shown), etc. Effectively, circuit VGEN3 provides voltage VNVGEN on node NVGEN to additional voltage keepers KPPR2, KPPR3, etc.

Circuit VGEN3 provides a voltage VNVGEN (not labeled) to node NVGEN based on operations of sub circuits VGEN31, VGEN32, and VGEN33. For example, when sub circuit VGEN31 is activated and sub circuits VGEN32 and VGEN33 are deactivated, sub circuit VGEN31 provides voltage VNVGEN to node NVGEN. When sub circuit VGEN32 is activated, and sub circuits VGEN31 and VGEN33 are deactivated, sub circuit VGEN32 provides voltage VNVGEN to node NVGEN. When sub circuit VGEN33 is activated and sub circuits VGEN31 and VGEN32 are deactivated, sub circuit VGEN33 provides voltage VNVGEN to node NVGEN.

In sub circuit VGEN31, a source of PMOS transistor P31 receives supply voltage VDD. A gate of PMOS transistor P31 receives a control signal KP31. A drain PMOS transistor is coupled with a source of a PMOS transistor P32. PMOS transistor P32 is configured as a diode. A gate and a drain of PMOS transistor P32 are coupled together and are coupled with a drain of an NMOS transistor N31 and with node NVGEN. A gate of NMOS transistor N31 receives supply voltage VDD, and a source of NMOS transistor N31 receives a supply reference voltage VSS, which, in some embodiments, is ground.

In operation, because the gate of NMOS transistor N31 receives supply voltage VDD, NMOS transistor N31 is always turned on. Effectively, signal KP31 at the gate of PMOS transistor P31 activates and deactivates circuit VGEN31. For example, when signal KP31 is logically high, PMOS transistor P31 is turned off, and transistors P31, P32, and N31 function as an open circuit. As a result, circuit VGEN31 is deactivated. In contrast, when signal KP31 is logically low, PMOS transistor P31 is turned on, a current flows from supply voltage VDD at the source of PMOS transistor P31 through transistors P31, P32, and N31 to ground at the source of NMOS transistor N31. In other words, circuit VGEN31 is activated.

For illustration, voltage VSDP31 (not labeled) is a voltage dropped across the source and the drain of PMOS transistor P31. In some embodiments, voltage VDP32 (not labeled) is a threshold voltage of PMOS transistor P32. Voltage VDP32 is also a voltage VSDP32 dropped across the source and the drain of PMOS transistor P32. When circuit VGEN31 is activated, voltage VNVGEN at node NVGEN is mathematically expressed as follow:

$$VNVGEN = VDD - VSDP31 - VSDP32$$

In sub circuit VGEN32, a source of a PMOS transistor P33 receives supply voltage VDD, a gate of PMOS transistor P33 receives a control signal KP32, and a drain of PMOS transistor P33 is coupled with node NVGEN. When signal KP32 is logically high, PMOS transistor P33 is turned off, and functions as an open circuit. Effectively, circuit VGEN32 is deactivated. In contrast, when signal KP32 is logically low, PMOS transistor P33 is turned on, and circuit VGEN32 is activated.

For illustration, a voltage VSDP33 (not labeled) is a voltage dropped across the source and the drain of PMOS transistor P33. When circuit VGEN32 is activated, voltage VNVGEN at node NVGEN is mathematically expressed as follows:

$$VNVGEN = VDD - VSDP33$$

In sub circuit VGEN33, a source of a PMOS transistor P34 receives supply voltage VDD. A gate of PMOS transistor P34 receives a control signal KP33. A drain of PMOS transistor P34 is coupled with a source of a PMOS transistor P35. PMOS transistor P35 and a PMOS transistor P36 are each configured as a diode. A gate and a drain of PMOS transistor P35 are coupled together and are coupled with a source of PMOS transistor P36 and with node NVGEN. A gate and a drain of PMOS transistor P36 are coupled together and are coupled with a drain of an NMOS transistor N39. A gate of NMOS transistor N39 receives a control signal KPB33, which is an inverse logic of control signal KP33. A source of NMOS transistor N39 receives supply reference voltage VSS, which, in some embodiments, is ground.

Signal KP33 and signal KPB33 activate and deactivate circuit VGEN33. For example, when signal KP33 is logically high, signal KPB33 is logically low. PMOS transistor P34 and NMOS transistor N39 are turned off. As a result, transistors P34, P35, P36, and N39 function as an open circuit, and circuit VGEN33 is deactivated. In contrast, when signal KP33 is logically low, signal KPB is logically high. PMOS transistor P34 and NMOS transistor N39 are turned on. Consequently, a current flows from supply voltage VDD at the source of PMOS transistor P34 through transistors P34, P35, P36, and N39. In other words, circuit VGEN33 is activated. Voltage VDD applied at the gate of transistor N31 is for illustration. Other voltage levels, instead of voltage VDD, are within the scope of various embodiments. For example, a control signal KN31 (not labeled) is applied at the gate of transistor N31 to turn on and off transistor N31. In such a situation, both signals KP31 and KN31 are used to activate and deactivate circuit VGEN31.

For illustration, a voltage drop across the source and the drain of PMOS transistor P34 is called VSDP34. Voltage VDP35 (not labeled) and VDP36 (not labeled) are voltages dropped across transistors configured as diodes P35 and P36, respectively. In some embodiments, voltages VDP35 and VDP36 are threshold voltages of corresponding transistors P35 and P36. Voltage VDP35 is also a voltage drop across the source and the drain of PMOS transistor P35, called VSDP35, for example. Similarly, voltage VDP36 is also a voltage drop across the source and the drain of PMOS transistor P36, called VSDP36, for example. When circuit VGEN33 is activated, voltage VNVGEN at node NVGEN is mathematically expressed as follows:

$$VNVGEN = VDD - VSDP34 - VSDP35$$

In some embodiments, a value of voltage VNVGEN on node NVGEN is provided based on a predetermined value of voltage VNKPPR1 on node NKPPR1. Effectively, circuit VGEN3 provides the predetermined value of voltage VNKPPR1. The predetermined value of voltage VNKPPR1 is explained below with reference to voltage keeper circuit KPPR1.

Sizes of transistors in each of sub circuits VGEN31, VGEN32, and VGEN33, are adjusted to provide a value of voltage VNVGEN on node NVGEN, which is voltage VNKPPR1 on node NKPPR1. Further, additional transistors, diodes, and other devices may be added to each of sub circuits VGEN31, VGEN32, and/or VGEN33 to provide a value of voltage VNKPPR1. Similarly, a transistor or diode may be removed from each of circuits VGEN31, VGEN32, and/or VGEN33 to provide a value of voltage VNKPPR1. Circuits VGEN31, VGEN32, and VGEN33 are used for illustration. Other circuits configured to provide a value of voltage VNKPPR1 are within the scope of various embodiments. For example, a voltage divider dividing voltage VDD to provide a voltage value of voltage VNKPPR1 is within the scope of various embodiments.

Voltage Keeper KPPR1

In voltage keeper KPPR1, a node NKPPR1 is coupled with node NVGEN of voltage generating circuit VGEN3.

A source of a PMOS transistor P37 receives supply voltage VDD. A gate of PMOS transistor P37 is coupled with node NKPPR1. A drain of PMOS transistor P37 is coupled with a source of a PMOS transistor P38. A gate of PMOS transistor P38 is coupled with an output of an inverter INV31. A drain of PMOS transistor P38 is coupled with an input of inverter INV31 and with read bit line RBL in FIG. 2.

Transistors P37 and P38 and inverters INV31 operate to keep read bit line RBL at a high logical value, such as after read bit line RBL is pre-charged for a read operation. For example, a voltage at node NKPPR1 coupled with the gate of PMOS transistor P37 is provided to turn on PMOS transistor P37. The voltage at node NKPPR1 is also voltage VNVGEN at node NVGEN. When read bit line RBL is logically high, the output of inverter INV31 coupled with the gate of PMOS transistor P38 is logically low. As a result, PMOS transistor P38 is turned on. Because transistors P37 and P38 are turned on, read bit line RBL coupled with the drain of PMOS transistor P38 is pulled to supply voltage VDD at the source of PMOS transistor P37. In other words, read bit line RBL is kept at a high logical value.

Read bit line RBL is coupled with a plurality of memory cells MEMCELL. In some embodiments, the number of memory cells MEMCELL coupled with read bit line RBL is the number of memory cells MEMCELL in a column of a memory bank of memory macro 100 in FIG. 1, such as a memory bank MEMBK1, MEMBK2, or MEMBK3, etc. The number of memory cells MEMCELLS coupled with read bit line RBL affects signal transitions of read bit line RBL. For example, when a memory cell MEMCELL in a column is read, a corresponding transistor N22 of memory cell MEMCELL in FIG. 2 is turned on, and the rest of transistors N22 in the same column are turned off. Each of the turned-off transistors N22 causes a leakage current, however, and affects signal transitions of read bit line RBL. When a larger number of memory cells MEMCELL is coupled with read bit line RBL, a larger leakage current results and has a larger impact on signal transitions of read bit line RBL. In contrast, when a smaller number of memory cells MEMCELL is coupled with read bit line RBL, a smaller leakage current results, and the impact of the leakage current on signal transitions of read bit line RBL is less.

A current IKPPR1 flows from the source of PMOS transistor P37 through PMOS transistor P38 to read bit line RBL.

A value of current IKPPR1 also affects signal transitions of read bit line RBL. For example, if a value of current IKPPR1 is high, read bit line RBL is easier to maintain at a high logical value, but is more difficult to transition from a high to a low logical value. In contrast, if the value of current IKPPR1 is low, read bit line RBL is more difficult to maintain at a high logical value, but is easier to transition from a high to a low logical value.

A value of current IKPPR1 depends on a value of a voltage VNKPPR1 (not labeled) at node NKPPR1 or the gate of transistor P37. For example, when a value of voltage VNKPPR1 is high, a value of current IKPPR1 is correspondingly high. In contrast, when a value of voltage VNKPPR1 is low, a current value of current IKPPR1 is correspondingly low. Effectively, a value of voltage NKPPR1 also affects the signal transitions of read bit line RBL because a value of current IKPPR1 affects the signal transitions of read bit line RBL. In some embodiments, voltage NKPPR1 and current IKPPR1 are related based on operations of PMOS transistor P37.

A size of each of transistors P37 and P38 also affects a value of current IKPPR1, and therefore also affects the signal transitions of read bit line RBL.

In some embodiments, one or a combination of a voltage value of voltage VNKPPR1 on node NKPPR1, a size of transistor P37, a size of transistor P38, a number of memory cells MEMCELL coupled with read bit line RBL, a size of transistor N21, a size of transistor N22 is adjusted to determine a value of current IKPPR1 and thus an effect on signal transitions of read bit line RBL.

In some embodiments, sizes of transistors N21, N22, P37, and P38, and the number of memory cells MEMCELL coupled with read bit line RBL are pre-determined based on a configuration of memory macro 100. In such embodiments, a value of voltage VNKPPR1 on node NKPPR1 is determined to affect signal transitions of read bit line RBL. A value of voltage VNKPPR1 is selected to provide a corresponding value of current IKPPR1. For example, when read bit line RBL is supposed to stay at a high logical value, a value of current IKPPR1 is selected to be sufficient to support the high logical value of read bit line RBL. In contrast, when one or a plurality of memory cells MEMCELLS coupled with read bit line RBL is accessed, a value of current IKPPR1 is selected to be sufficiently low for read bit line RBL is able to transition from a high to a low logical value.

Because node NVGEN and node NKPPR1 are coupled together, a value of voltage VNGEN is the same as a value of voltage VNKPPR1. In some embodiments, once voltage VNKPPR1 on node KPPR1 is determined, circuit VGEN3 is configured to provide a corresponding voltage VNVGEN on node NVGEN as illustratively explained above.

Voltage Generating Circuit VGEN4

Figure 4:
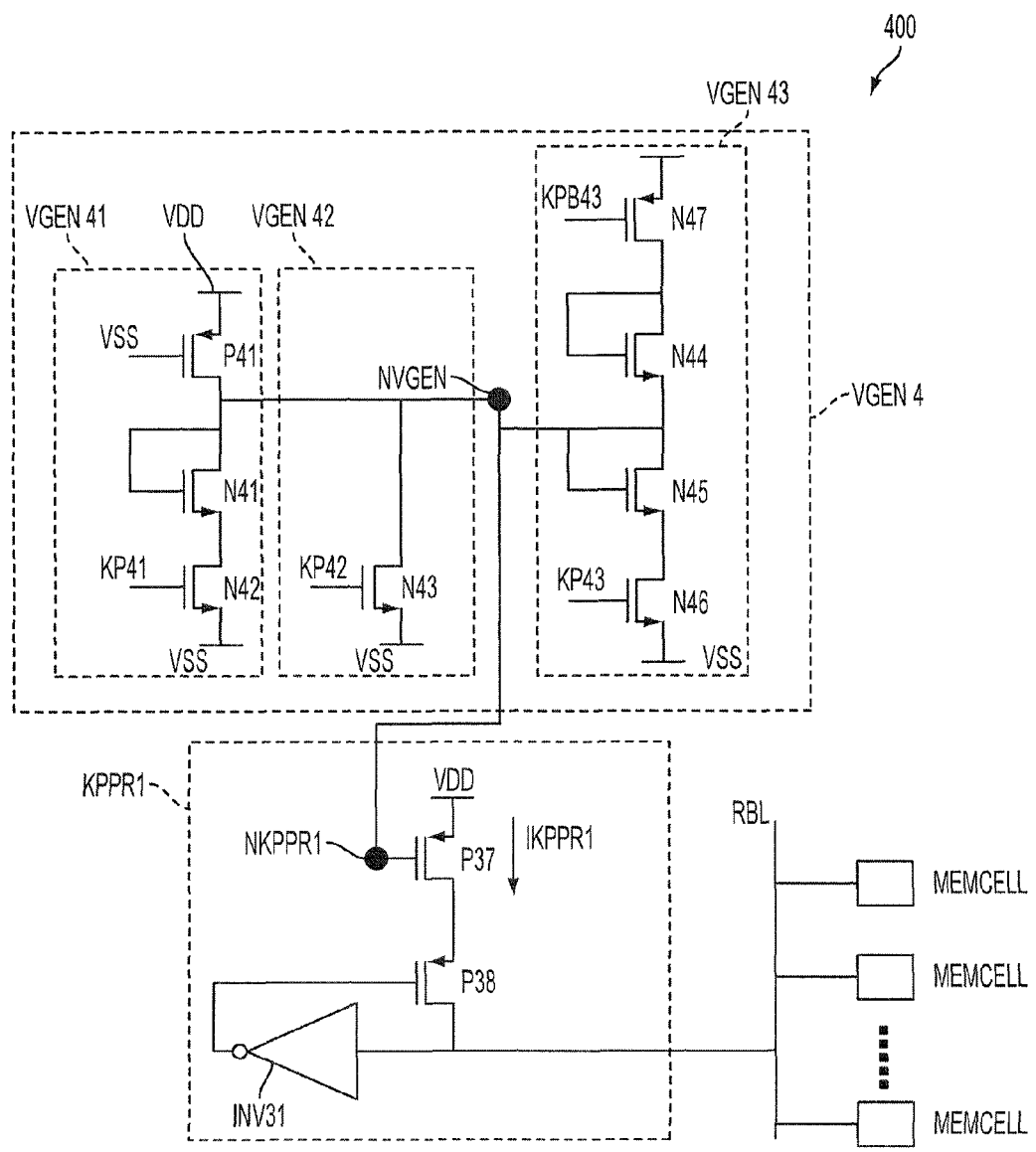
FIG. 4 is a diagram of a circuit that includes another embodiment of the voltage generating circuit of the memory macro in FIG. 1, in accordance with some embodiments.

FIG. 4 is a diagram of a circuit 400, in accordance with some embodiments. Compared with circuit 300, circuit 400 includes a voltage generating circuit VGEN4 used in place of voltage generating circuit VGEN3 in FIG. 3. Effectively, voltage generating circuit VGN4 is an embodiment of voltage generating circuit VGEN in FIG. 1. Voltage generating circuit VGEN4 provides voltage VNVGEN on node NVGEN to voltage keepers similar to voltage generating circuit VGEN3 does, except that voltage generating circuit VGEN4 generates voltage VNVGEN differently.

Voltage generating circuit VGEN4 includes sub circuits VGEN41, VGEN42, and VGEN43 corresponding to sub circuits VGEN31, VGEN32, and VGEN33 in FIG. 3, respectively.

Circuit VGEN4 provides voltage VNVGEN to node NVGEN based on operations of sub circuits VGEN41, VGEN42, and VGEN43 of circuit VGEN4. For example, when sub circuit VGEN41 is activated and sub circuits VGEN42 and VGEN43 are deactivated, sub circuit VGEN41 provides voltage VNVGEN to node NVGEN. When sub circuit VGEN42 is activated, and sub circuits VGEN41 and VGEN43 are deactivated, sub circuit VGEN42 provides voltage VNVGEN to node NVGEN. When sub circuit VGEN43 is activated and sub circuits VGEN41 and VGEN42 are deactivated, sub circuit VGEN43 provides voltage VNVGEN to node NVGEN.

In sub circuit VGEN41, a source of a PMOS transistor P41 receives supply voltage VDD. A gate of PMOS transistor P41 receives supply reference voltage VSS. A drain of PMOS transistor P41 is coupled with node NVGEN and with a drain and a gate of an NMOS transistor N41. NMOS transistor N41 is configured as a diode because the drain and the gate of NMOS transistor N41 are coupled together. A source of NMOS transistor N41 is coupled with a drain of an NMOS transistor N42. A gate of NMOS transistor N42 receives a control signal KP41. A source of NMOS transistor N42 receives supply reference voltage VSS, which, in some embodiments, is ground.

In operation, because the gate of PMOS transistor P41 receives supply reference voltage VSS, PMOS transistor P41 is always turned on. Effectively, signal KP41 at the gate of NMOS transistor N42 activates and deactivates circuit VGEN41. For example, when signal KP41 is logically low, NMOS transistor N42 is turned off, and transistors P41, N41, and N42 function as an open circuit. As a result, circuit VGEN41 is deactivated. In contrast, when signal KP41 is logically high, NMOS transistor N42 is turned on, a current flows from supply voltage VDD at the source of PMOS transistor P41 through transistors P41, PN41, and N42 to ground at the source of NMOS transistor N42. In other words, circuit VGEN41 is activated.

For illustration, a voltage VDN41 (not labeled) represents a voltage dropped across NMOS transistor N41 or diode N41. Voltage VDN41 is also a voltage drop across the drain and the source of NMOS transistor N41, which is called VDSN41 for illustration. A voltage VDSN42 a voltage drop across the drain and the source of NMOS transistor N42. When circuit VGEN41 is activated, voltage VNVGEN at node NVGEN is mathematically expressed as follow:

$$VNVGEN = VDSN41 + VDSN42$$

In sub circuit VGEN42, a drain of an NMOS transistor N43 is coupled with node NVGEN, a gate of NMOS transistor N43 receives a control signal KP42, and a drain of NMOS transistor N43 receives supply reference voltage VSS. When signal KP42 is logically low, NMOS transistor N43 is turned off, and functions as an open circuit. Effectively, circuit VGEN42 is deactivated. In contrast, when signal KP42 is logically high, NMOS transistor N43 is turned on, and circuit VGEN42 is activated.

For illustration, a voltage VDSN43 represents a voltage drop across the drain and the source of NMOS transistor N43. When circuit VGEN42 is activated, voltage VNVGEN at node NVGEN is mathematically expressed as follow:

$$VNVGEN = VDSN43$$

In sub circuit VGEN43, a source of a PMOS transistor N47 receives supply voltage VDD. A gate of PMOS transistor P47 receives a control signal KPB43. A drain of PMOS transistor is coupled with a drain of an NMOS transistor N44. NMOS transistor N44 and an NMOS transistor N45 are each configured as a diode. A gate and a drain of NMOS transistor N44 are coupled together and are coupled with node NVGEN. A source of NMOS transistor N44 is coupled with a gate and a drain of NMOS transistor N455. A source of NMOS transistor N45 is coupled with a drain of an NMOS transistor N46. A gate of NMOS transistor N46 receives a control signal KP43. A source of NMOS transistor N46 receives supply reference voltage VSS. Control signal KP43 is an inverse logic of control signal KPB43.

Signal KPB43 and signal KP43 activate and deactivate circuit VGEN43. For example, when signal KPB43 is logically high, signal KP43 is logically low. PMOS transistor P47 and NMOS transistor N46 are turned off. As a result, transistors P47, N44, N45, and N46 function as an open circuit, and circuit VGEN43 is deactivated. In contrast, when signal KPB43 is logically low and signal KP43 is logically high, PMOS transistor P47 and NMOS transistor N46 are turned on. Consequently, a current flows from supply voltage VDD at the source of PMOS transistor P47 through transistors P47, N44, N45, and N46 through ground at the source of NMOS transistor N46. In other words, circuit VGEN43 is activated.

For illustration, VDSN45 represents a voltage drop between the drain and the source of NMOS transistor N45, and VDSN46 represents a voltage drop the drain and the source of NMOS transistor N46. When circuit VGEN43 is activated, voltage VNVGEN at node NVGEN is mathematically expressed as follows:

$$VNVGEN=VDSN45+VDSN46$$

Sizes of transistors in each of sub circuits VGEN41, VGEN42, and VGEN43, are adjusted to provide a value of voltage VNVGEN or voltage VNKPPR1. Further, additional transistors, diodes, and other devices may be added to each of sub circuits VGEN41, VGEN42, and/or VGEN43 to provide a value of voltage VNKPPR1. Similarly, a transistor or diode may be removed from each of circuits VGEN41, VGEN42, and/or VGEN43 to provide a value of voltage VNKPPR1. Circuits VGEN41, VGEN42, and VGEN43 are used for illustration. Other circuits configured to provide a value of voltage VNKPPR1 are within the scope of various embodiments. For example, a voltage divider dividing supply voltage VDD to provide a value of voltage VNKPPR1 is within the scope of various embodiments.

Exemplary Method

Figure 5:
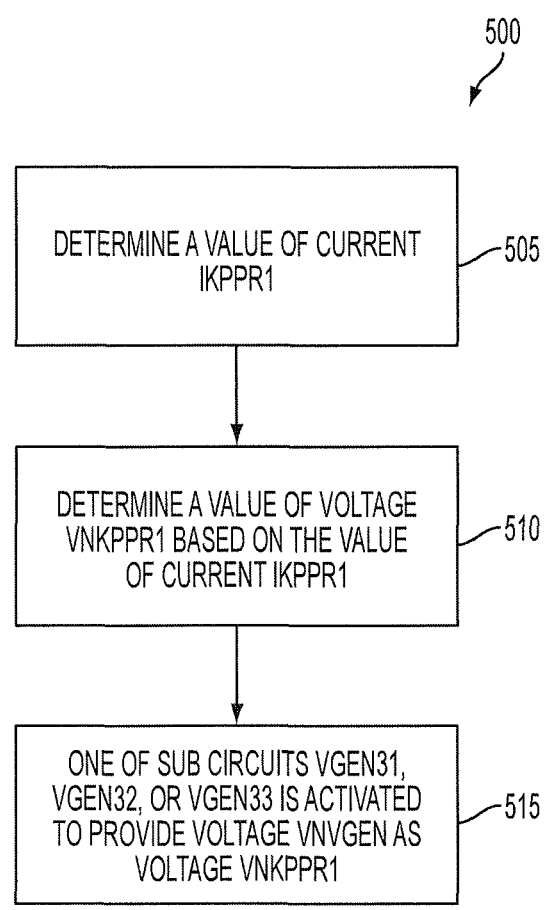
FIG. 5 is a flowchart of a method of operating the circuit in FIG. 3, in accordance with some embodiments.

FIG. 5 is a flow chart of a method 500, in accordance with some embodiments. Method 500 illustrates an operation of circuit 300 in FIG. 3.

In operation 505, a value of current IKPPR1 is determined. In some embodiments, the value of current IKPPR1 is selected such that, when read bit line RBL is logically high, current IKPPR1 is large enough to keep read bit line RBL at the high logical value. The value of current IKPPR1 is also selected such that when read bit line RBL transitions from a high to a low logical value, current IKPPR1 is low enough to enable such a transition. In some embodiments, the value of current IKPPR1 is determined based on simulation.

In operation 510, a value of voltage VNKPPR1 is determined based on the value of current IKPPR1 determined in operation 505. For example, the value of voltage VNKPPR1 is determined based on operations of PMOS transistor P37, and, in some embodiments, is determined based on simulation.

In operation 515, one of sub circuits VGEN31, VGEN32, and VGEN33 is activated to provide voltage VNVGEN as voltage VNKPPR1 as explained above. In some embodiments, voltage VNVGEN is selected to best match voltage VNKPPR1.

In method 500, circuit 300 in FIG. 3 is used for illustration. Operations of circuit 400 in FIG. 4 are similar. For example, in the case of circuit 400, in operation 515, one of sub circuits VGEN41, VGEN42, and VGEN42 is activated to provide voltage VNVGEN as explained above.

A circuit VGEN implemented by a circuit VGEN3 or VGEN4 used with one voltage keeper KPPR1 is used for illustration. Each of circuit VGEN used with a plurality of voltage keepers is similar, and is within the scope of various embodiments. For example, circuit VGEN is used with voltage keepers KPPR1 and KPPR2 in FIG. 1.

Each of circuits VGEN3 and VGEN4 is also used for illustration. Other circuits providing voltage VNVGEN are within the scope of various embodiments.

Current Generating Circuit and Voltage Keepers

Figure 6:
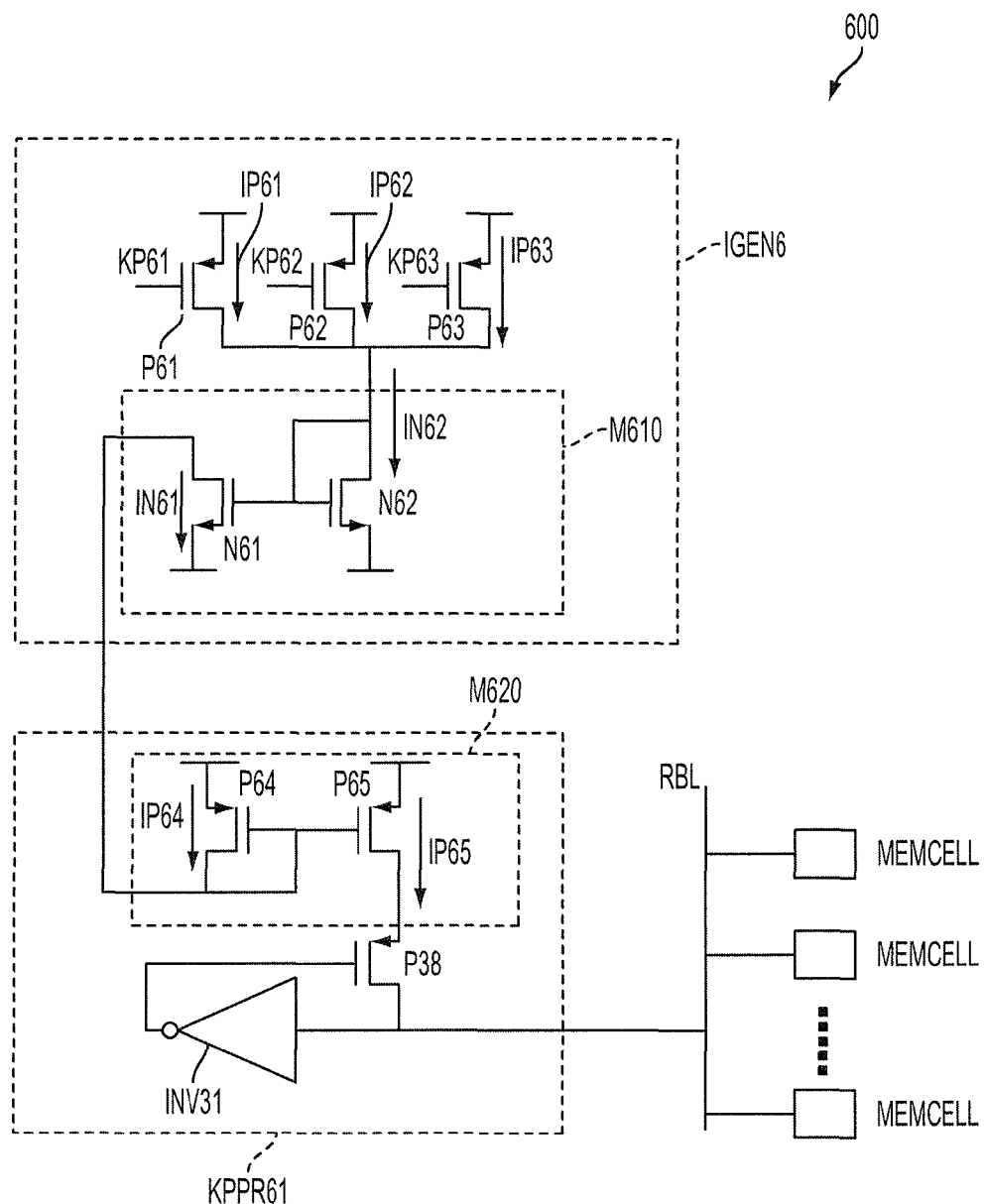
FIG. 6 is a diagram of a circuit that includes a current generating circuit and a voltage keeper circuit of the memory macro in FIG. 1, in accordance with some embodiments.

FIG. 6 is a diagram of a circuit 600, in accordance with some embodiments. Circuit 600 includes a current generating circuit IGEN6 and a voltage keeper KPPR61. Circuit IGEN6 corresponds to circuit VGEN in FIG. 1 except that circuit VGEN generates a voltage while circuit IGEN6 generates a current. Voltage keeper KPPR61 corresponds to a voltage keeper KPPR1 or KPPR2, but has a different configuration adapted to receive a current from current generating circuit IGEN6.

A signal KP61 controls a PMOS transistor P61. For example, when signal KP61 is logically low, PMOS transistor P61 is turned on and generates a current IP61. But when signal KP61 is logically high, PMOS transistor P61 is turned off, and there is no current IP61.

A signal KP62 controls a PMOS transistor P62. For example, when signal KP62 is logically low, PMOS transistor P62 is turned on and generates a current IP62. But when signal KP62 is logically high, PMOS transistor P62 is turned off, and there is no current IP62.

Similarly, a signal KP63 controls a PMOS transistor P63. For example, when signal KP63 is logically low, PMOS transistor P63 is turned on and generates a current IP63. But when signal KP63 is logically high, PMOS transistor P63 is turned off, and there is no current IP63.

A value of a current IN62 is a sum of a value of currents IP61, IP62, and IP63. The value of current IN62 changes based on an on-or-off status of each of transistors P61, P62, and P63. For example, when transistors P61, P62, and P63 are all turned on, a value of current IN62 is a sum of a value of currents IP61, IP62, IP63. For another example, when transistor P61 is on and transistors P62 and P63 are off, a value of current IN62 is a value of current IP61. For another example, when transistors P61 and P62 are on and transistor P63 is off, a value of current IN62 is a sum of a value of currents IP61 and IP62, etc.

A current mirror M610 is formed by NMOS transistors N61 and N62, and mirrors current IN62 to a current IN61. Current IN61 is the same as a current IP64 because current IP64 flows from a source of transistor P64 through transistor P64 and transistor IN61 through ground at a source of transistor N61.

A current mirror M620 is formed by PMOS transistors P64 and P65, and mirrors current IP64 to a current IP65. Effectively, current mirrors M610 and M620 mirror current IN62 to current IP65. In operations, current mirrors M610 and M620 provide current IN62 mirrored to current IP65 to transistor P38 to keep a high logical value for read bit line RBL. For example, when read bit line RBL is logically high, the output of inverter INV31 is logically low and turns on transistor P38 that serves as a current path for current IP65 mirrored from current IN62. When a value of current IN62 is large, a high logical value of read bit line RBL is maintained. But if a value of current IN62 is small, read bit line RBL is pulled away from the high logical value. In some embodiments, the value of current IP65 is selected such that, when read bit line RBL is logically high, current IP65 is large enough to keep read bit line RBL at the high logical value. The value of current IP65 is also selected such that when read bit line RBL transitions from a high to a low logical value, current IP65 is low enough to not significantly interfere with such a transition. In some embodiments, the value of current IP65 is determined based on simulation.

Figure 7:
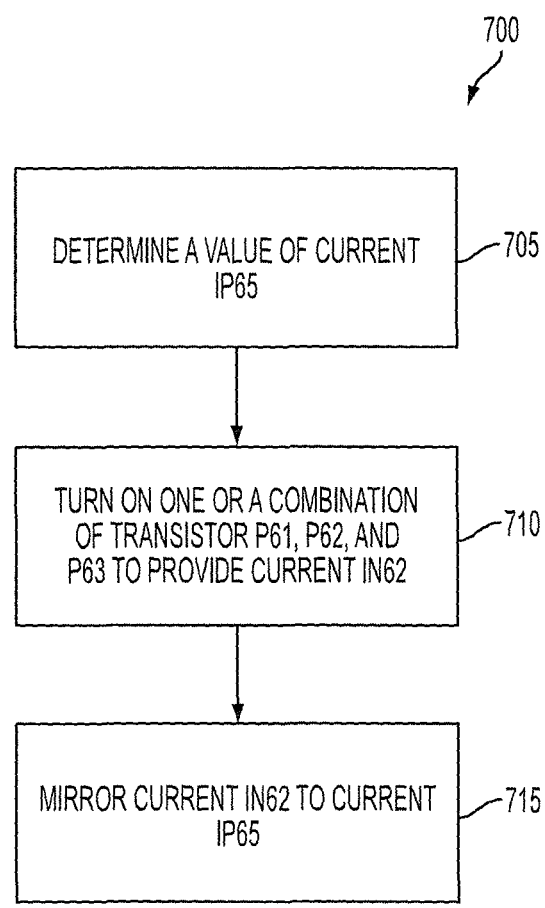
FIG. 7 is a flowchart of a method of operating the circuit in FIG. 6, in accordance with some embodiments.

FIG. 7 is a flowchart of a method 700, in accordance with some embodiments. Method 700 illustrates an operation of circuit 600 in FIG. 6.

In operation 705, a value of current IP65 is determined as illustrated above in step 505 (FIG. 5).

In operation 710, one or a combination of transistors P61, P62, and P63 is activated to provide current IN62, which is equal to current IP65.

In operation 715, current mirrors M610 and M620 mirror current IN62 to provide current IP65.

PMOS transistors P61, P62, and P63 used to provide current IN62 are for illustration. Other circuits are within scope of various embodiments.

One circuit IGEN6 used with one current keeper KPPR61 is for illustration. One circuit IGEN6 used with more than one current KPPR61 is within the scope of various embodiments.

With reference to circuit 600, various embodiments of the disclosure are advantageous. For example, a total die area for current generating circuit 600 and a plurality of voltage keepers KPPR61 is smaller than a die area for a compatible circuit in another approach.

In some embodiments, a circuit includes a voltage generating circuit and a voltage keeper circuit. The voltage generating circuit includes a first node. The voltage keeper circuit includes a second node and a third node. The first node is coupled with the second node. The voltage generating circuit is configured to generate a voltage value at the first node and the second node to maintain the third node at a particular third node voltage.

In some embodiments, a memory macro comprises a plurality of memory banks, a voltage generating circuit, a plurality of voltage keeper circuits, and a plurality of data lines. Each data line of the plurality of data lines is coupled with each voltage keeper circuit of the plurality of voltage keeper circuits and with a plurality of memory cells in a memory bank of the plurality of memory banks. The voltage generating circuit is configured to provide a voltage to the each voltage keeper circuit at a node of the each voltage keeper circuit. Based on the voltage provided by the voltage generating circuit, the each voltage keeper circuit of the plurality of voltage keeper circuits is configured to keep the each data line at a data line voltage.

In some embodiments, a circuit comprises a voltage generating circuit, a first transistor, a second transistor, and an inverter. The first transistor and the second transistor are coupled in series. An input of the inverter is coupled with a first terminal of the second transistor. An output of the inverter is coupled with a second terminal of the second transistor. The voltage generating circuit is configured to provide a voltage value out of a plurality of voltage values to a first terminal of the first transistor.

In some embodiments, a circuit comprises a current generating circuit, a voltage keeper circuit, and a current mirror coupled with the current generating circuit and with the voltage keeper circuit. The current generating circuit is configured to generate a first current. The current mirror is configured to mirror the first current to a second current. The voltage keeper circuit is configured to receive the second current for use in maintaining a voltage vale of a node.

A number of embodiments have been described. It will nevertheless be understood that various modifications may be made without departing from the spirit and scope of the disclosure. For example, various transistors being shown as a particular dopant type, e.g., N-type or P-type Metal Oxide Semiconductor (NMOS or PMOS) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular value when a signal is activated and/or deactivated. Selecting different logical values is within the scope of various embodiments. In various embodiments, a transistor functions as a switch. A switching circuit used in place of a transistor is within the scope of various embodiments. In some embodiments, a drain of a transistor is configurable as a source of the same transistor, and a source of the transistor is configurable as the drain of the same transistor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a voltage generating circuit including a first node; and
a voltage keeper circuit including a second node and a third node,
wherein
the voltage keeper circuit comprises a first transistor, a gate of the first transistor being electrically coupled with the second node of the voltage keeper circuit;
the first node is coupled with the second node; and
the voltage generating circuit is configured to generate a voltage value at the first node and the second node to maintain the third node at a particular third node voltage.

2. The circuit of claim 1, wherein
the circuit further comprises a data line and a plurality of memory cells coupled to the data line; and
the third node is coupled with the data line.

3. The circuit of claim 1, wherein
the circuit further comprises at least one other voltage keeper circuit;
each voltage keeper circuit of the at least one other voltage keeper circuit includes a corresponding other second node and other third node; and
the first node is coupled with the other second node of each voltage keeper circuit of the at least one other voltage keeper circuit.

4. The circuit of claim 1, wherein
the voltage generating circuit includes at least one of a first sub circuit, a second sub circuit, or a third sub circuit;
the first sub circuit includes a first PMOS transistor, a second PMOS transistor, and a third NMOS transistor, wherein
a source of the first PMOS transistor is configured to receive a supply voltage;

a gate of the first PMOS transistor is configured to receive a control signal;
a drain of the first PMOS transistor is coupled with a source of the second PMOS transistor;
a gate of the second PMOS transistor is coupled with a drain of the second PMOS, a drain of the first NMOS transistor, and the first node;
a source of the first NMOS transistor is configured to receive a supply reference voltage;
the second sub circuit includes a third PMOS transistor, wherein
a source of the third PMOS transistor is configured to receive the supply voltage;
a gate of third PMOS transistor is configured to receive a second control signal;
a drain of the third PMOS transistor is coupled with the first node;
the third sub circuit includes a fourth PMOS transistor, a fifth PMOS transistor, a sixth PMOS transistor, and a second NMOS transistor,
wherein
a source of the fourth PMOS transistor is configured to receive the supply voltage;
a gate of the fourth PMOS transistor is configured to receive a third control signal;
a drain of the fourth PMOS transistor is coupled with a source of the fifth PMOS transistor;
a gate of the fifth PMOS transistor is coupled with the first node, a drain of the fifth PMOS transistor, and a source of sixth PMOS transistor;
a gate of the sixth PMOS transistor is coupled with a drain of the sixth PMOS transistor and a drain of the second NMOS transistor;
a gate of second NMOS transistor is configured to receive a fourth control signal;
the fourth control signal is an inverse logic of the third control signal; and
a source of the second NMOS transistor is configured to receive a supply reference voltage.

5. The circuit of claim 1, wherein
the voltage generating circuit includes at least one of a first sub circuit, a second sub circuit, and a third sub circuit;
the first sub circuit includes a first PMOS transistor, a first NMOS transistor and a second NMOS transistor,
wherein
a source of the first PMOS transistor is configured to receive a supply voltage;
a drain of the first PMOS transistor, a drain of the first NMOS transistor, a gate of the first NMOS transistor, and the first node are coupled together;
a source of the first NMOS transistor and a drain of the second NMOS transistor are coupled together;
a gate of the second NMOS transistor is configured to receive a first control signal;
a source of the second NMOS transistor is configured to receive the reference supply voltage;
the second sub circuit includes a third NMOS transistor, wherein
a drain of the third NMOS transistor is coupled with the first node;
a gate of the third NMOS transistor is configured to receive a second control signal;
a source of the third NMOS transistor is configured to receive the reference supply voltage;
the third sub circuit includes a second PMOS transistor, a fourth NMOS transistor, a fifth NMOS transistor, and a sixth NMOS transistor,
wherein
a source of the second PMOS transistor is configured to receive the supply voltage;
a gate of the second PMOS transistor is configured to receive a third control signal;
a drain of the second PMOS transistor is coupled with a drain of the fourth NMOS transistor and a gate of the fourth NMOS transistor;
a source of the fourth NMOS transistor, a drain of the fifth NMOS transistor, a gate of the fifth NMOS transistor, and the first node are coupled together;
a source of the fifth NMOS transistor and a drain of the sixth NMOS transistor are coupled together;
a gate of the sixth NMOS transistor is configured to receive a fourth control signal;
a fourth control signal is an inverse logic of the third control signal; and
a source of the sixth NMOS transistor is configured to receive the reference supply voltage.

6. The circuit of claim 1, wherein the voltage generating circuit is configured to generate the voltage value based on a supply voltage value of the voltage generating circuit.

7. The circuit of claim 1, wherein
the voltage keeper circuit further comprises a second transistor and an inverter;
the first transistor and the second transistor are coupled in series;
an input of the inverter is coupled with a first terminal of the second transistor; and
an output of the inverter is coupled with a second terminal of the second transistor.

8. The circuit of claim 7, wherein
the first transistor and the second transistor are of a P-type;
a source of the first transistor is configured to receive a supply voltage;
a drain of the first transistor is coupled with a source of the second transistor;
the first terminal of the second transistor is a drain of the second transistor; and
the second terminal of the second transistor is a gate of the second transistor.

9. The memory macro of claim 7, wherein
the input of the inverter is coupled with a data line of the plurality of data lines and with a plurality of memory cells of the memory macro.

10. A memory macro comprising:
a plurality of memory banks;
a voltage generating circuit;
a plurality of voltage keeper circuits; and
a plurality of data lines,
wherein
each data line of the plurality of data lines is coupled with each voltage keeper circuit of the plurality of voltage keeper circuits and with a plurality of memory cells in a memory bank of the plurality of memory banks;
the voltage generating circuit is configured to provide a voltage to the each voltage keeper circuit at a node of the each voltage keeper circuit; and
based on the voltage provided by the voltage generating circuit, the each voltage keeper circuit of the plurality of voltage keeper circuits is configured to keep the each data line at a data line voltage.

11. The circuit of claim 10, wherein
the voltage generating circuit includes at least one of a first sub circuit, a second sub circuit, and a third sub circuit;

the first sub circuit includes a first PMOS transistor, a second PMOS transistor, and a third NMOS transistor, wherein
  a source of the first PMOS transistor is configured to receive a supply voltage;
  a gate of the first PMOS transistor is configured to receive a control signal;
  a drain of the first PMOS transistor is coupled with a source of the second PMOS transistor;
  a gate of the second PMOS transistor is coupled with a drain of the second PMOS, a drain of the first NMOS transistor, and the first node;
  a source of the first NMOS transistor is configured to receive a supply reference voltage;
the second sub circuit includes a third PMOS transistor, wherein
  a source of the third PMOS transistor is configured to receive the supply voltage;
  a gate of third PMOS transistor is configured to receive a second control signal;
  a drain of the third PMOS transistor is coupled with the first node;
the third sub circuit includes a fourth PMOS transistor, a fifth PMOS transistor, a sixth PMOS transistor, and a second NMOS transistor, wherein
  a source of the fourth PMOS transistor is configured to receive the supply voltage;
  a gate of the fourth PMOS transistor is configured to receive a third control signal;
  a drain of the fourth PMOS transistor is coupled with a source of the fifth PMOS transistor;
  a gate of the fifth PMOS transistor is coupled with the first node, a drain of the fifth PMOS transistor, and a source of sixth PMOS transistor;
  a gate of the sixth PMOS transistor is coupled with a drain of the sixth PMOS transistor and a drain of the second NMOS transistor;
  a gate of second NMOS transistor is configured to receive a fourth control signal;
  the fourth control signal is an inverse logic of the third control signal; and
  a source of the second NMOS transistor is configured to receive a supply reference voltage.

12. The circuit of claim 10, wherein
the voltage generating circuit includes at least one of a first sub circuit, a second sub circuit, and a third sub circuit;
the first sub circuit includes a first PMOS transistor, a first NMOS transistor and a second NMOS transistor, wherein
  a source of the first PMOS transistor is configured to receive a supply voltage;
  a drain of the first PMOS transistor, a drain of the first NMOS transistor, a gate of the first NMOS transistor, and the first node are coupled together;
  a source of the first NMOS transistor and a drain of the second NMOS transistor are coupled together;
  a gate of the second NMOS transistor is configured to receive a first control signal;
  a source of the second NMOS transistor is configured to receive the reference supply voltage;
the second sub circuit includes a third NMOS transistor, wherein
  a drain of the third NMOS transistor is coupled with the first node;
  a gate of the third NMOS transistor is configured to receive a second control signal;
  a source of the third NMOS transistor is configured to receive the reference supply voltage;
the third sub circuit includes a second PMOS transistor, a fourth NMOS transistor, a fifth NMOS transistor, and a sixth NMOS transistor, wherein
  a source of the second PMOS transistor is configured to receive the supply voltage;
  a gate of the second PMOS transistor is configured to receive a third control signal;
  a drain of the second PMOS transistor is coupled with a drain of the fourth NMOS transistor and a gate of the fourth NMOS transistor;
  a source of the fourth NMOS transistor, a drain of the fifth NMOS transistor, a gate of the fifth NMOS transistor, and the first node are coupled together;
  a source of the fifth NMOS transistor and a drain of the sixth NMOS transistor are coupled together;
  a gate of the sixth NMOS transistor is configured to receive a fourth control signal;
  a fourth control signal is an inverse logic of the third control signal; and
  a source of the sixth NMOS transistor is configured to receive the reference supply voltage.

13. The memory macro of claim 10, wherein
the voltage generating circuit is configured to provide the voltage to the each voltage keeper circuit at a node of the each voltage keeper circuit based on a supply voltage value of the voltage generating circuit.

14. The memory macro of claim 10, wherein
the voltage keeper circuit includes a first transistor, a second transistor, and an inverter;
the first transistor and the second transistor are coupled in series;
an input of the inverter is coupled with a first terminal of the second transistor; and
an output of the inverter is coupled with a second terminal of the second transistor.

15. The memory macro of claim 14, wherein
the first transistor and the second transistor are of a P-type;
a source of the first transistor is configured to receive a supply voltage;
the node of the each voltage keeper is coupled with a gate of the first transistor;
a drain of the first transistor is coupled with a source of the second transistor;
the first terminal of the second transistor is a drain of the second transistor; and
the second terminal of the second transistor is a gate of the second transistor.

16. The memory macro of claim 14, wherein
the input of the inverter is coupled with a data line of the plurality of data lines and with a plurality of memory cells of the memory macro.

17. A circuit comprising:
a current generating circuit;
a voltage keeper circuit; and
a current mirror coupled with the current generating circuit and with the voltage keeper circuit,
wherein
  the current generating circuit is configured to generate a first current;
  the current mirror is configured to mirror the first current to a second current; and
  the voltage keeper circuit is configured to receive the second current for use in maintaining a voltage vale of a node of the voltage keeper circuit.

18. The circuit of claim 17, wherein
the current generating circuit includes a plurality of current sources; and
a value of the first current is based on a value of at least one current source of the plurality of current sources.
19. The circuit of claim 18, wherein
a current source of the plurality of current sources includes a transistor providing a corresponding current.
20. The circuit of claim 17, wherein
the circuit further comprises a data line and a plurality of memory cells coupled to the data line; and
the node of the voltage keeper circuit is coupled with the data line.

\* \* \* \* \*